United States Patent
Takahashi

(10) Patent No.: US 7,955,963 B2
(45) Date of Patent: Jun. 7, 2011

(54) DRY ETCHING METHOD FOR SEMICONDUCTOR DEVICE

(75) Inventor: Akira Takahashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 10/798,482

(22) Filed: Mar. 12, 2004

(65) Prior Publication Data

US 2005/0067658 A1 Mar. 31, 2005

(30) Foreign Application Priority Data

Sep. 26, 2003 (JP) ................................ 2003-334784

(51) Int. Cl.
*H01L 21/3205* (2006.01)

(52) U.S. Cl. ............... 438/585; 257/369; 257/E21.638; 438/183

(58) Field of Classification Search .................. 438/199, 438/183, 547, 548, 200, 275, 281, 592, 664, 438/85, 587; 257/350, 351, 368, 369, E21.638, 257/355, 357, 364, 412, 413

See application file for complete search history.

(56) References Cited

U.S. PATENT DOCUMENTS

| | | | | |
|---|---|---|---|---|
| 4,989,057 A * | 1/1991 | Lu | | 257/357 |
| 5,116,778 A * | 5/1992 | Haskell et al. | | 438/221 |
| 5,637,900 A * | 6/1997 | Ker et al. | | 257/355 |
| 5,665,203 A * | 9/1997 | Lee et al. | | 438/585 |
| 5,783,850 A * | 7/1998 | Liau et al. | | 257/355 |
| 5,827,761 A * | 10/1998 | Fulford et al. | | 438/199 |
| 5,998,247 A * | 12/1999 | Wu | | 438/200 |
| 6,020,240 A * | 2/2000 | Wu | | 438/275 |
| 6,103,603 A * | 8/2000 | Han | | 438/532 |
| 6,117,723 A * | 9/2000 | Huang | | 438/238 |
| 6,175,136 B1 | 1/2001 | Okamura | | |
| 6,376,294 B1 * | 4/2002 | Tzeng et al. | | 438/210 |
| 6,429,067 B1 * | 8/2002 | Liu et al. | | 438/241 |
| 6,541,359 B1 * | 4/2003 | Gabriel et al. | | 438/585 |
| 6,605,543 B1 * | 8/2003 | Zheng | | 438/710 |
| 6,703,269 B2 * | 3/2004 | Brown et al. | | 438/199 |
| 2003/0015763 A1 * | 1/2003 | Yoneda | | 257/411 |

FOREIGN PATENT DOCUMENTS

| | | |
|---|---|---|
| JP | 11-204506 | 7/1999 |
| JP | 2000-058511 | 2/2000 |
| JP | 2000-164732 | 6/2000 |

* cited by examiner

*Primary Examiner* — Thao X Le
*Assistant Examiner* — William F Kraig
(74) *Attorney, Agent, or Firm* — Rabin & Berdo, P.C.

(57) ABSTRACT

The present invention provides a device having an N type polysilicon gate and a P type polysilicon gate disposed therein, wherein when both gates are simultaneously etched, they are disposed in such a manner that the area of a non-doped polysilicon gate corresponding to a dummy electrode becomes larger than the total area of the N type and P type doped polysilicon gates, thereby causing non-doped polysilicon to become dominant over doped polysilicon, whereby the polysilicon gates are dry-etched.

9 Claims, 3 Drawing Sheets

DRY ETCHING METHOD FOR SEMICONDUCTOR DEVICE

BACKGROUND OF THE INVENTION

1. Field of the Invention

The present invention relates to a dry etching method suitable for use in a semiconductor device, and particularly to a dry etching method suitable for use in a semiconductor device in which an N type polysilicon gate and a P type polysilicon gate exist in mixed form.

2. Description of the Related Art

The scale-down or miniaturization of a semiconductor element has definitely been put forward at the request of the speeding up of an LSI and a reduction in its power consumption. As to a process for manufacturing a gate electrode in particular, the accuracy of its formation leads to the performance of a transistor, by extension, it is significantly related to the capability of the whole LSI. Therefore, this encounters a confrontation with a strict demand in particular. Simultaneously with an improvement in dimensional accuracy, there has also been a demand for an improvement in driving force of the transistor. In a prior device, the doping of a gate with an impurity has generally been performed on a self-alignment basis upon a source/drain ion implanting process after the patterning formation of the gate.

In this case, only a non-doped polysilicon (Poly-Si) electrode may be etched in a gate patterning process. Since, however, this method is not capable of sufficiently obtaining the driving force of the transistor, a system (hereinafter called "dual gate system") for doping a gate electrode with an impurity in advance before etching now starts to be adopted. This system will cause a need to take into consideration the type of impurity and a difference in dimension due to impurity density in addition to a difference in dimension due to the loose/dense difference between patterns upon etching.

FIG. 1 shows the result of measurement of dimensions where the dual gate system is adopted. When etching conditions are set such that the dimension of an N type polysilicon gate is controlled constant, the dimension of a P type polysilicon gate greatly changes. When the amount of ion-implantation of an impurity is small, there is little difference in dimension, whereas when phosphor (P) and boron (B) are respectively ion-implanted into the gates by a dose of 5E15 $cm^{-2}$, a dimensional difference of about 0.037 μm takes place. That is, it is understood that the difference in dimension between two types of different gate regions extends in proportion to a density difference.

When normal two-stage dry etching constituted of, for example, a main step ($HBr/O_2$ flow rate=100/3 sccm, high-frequency power/low-frequency power=250 W/30 W, pressure: 1 Pa and temperature: 60° C.) and an overetching step ($HBr/O_2$/He flow rate=100/2/100 sccm, high-frequency power/low frequency power=250 W/50 W, pressure: 8 Pa and temperature: 60° C.) is performed, end point detection in the main step occurs in an N type polysilicon gate region fast in etching rate. Upon the end point detection, polysilicon in a P type polysilicon gate region still remains. Further, the remaining polysilicon is etched under an overetch condition corresponding to the next overetching step. Therefore, each P type polysilicon gate is assumed to be taper-shaped as shown in FIG. 2. This tendency takes place regardless of the looseness/denseness of patterns.

On the other hand, the technique of flattening an interlayer insulating film by chemical mechanical polishing or the like to ensure a margin by photolithography under a strict design rule with the scale-down of an LSI has been applied to a large number of devices. However, it is understood that since, however, the pressure at each point on a wafer changes because the pattern density is ununiform, the dependence of the pattern density on the amount of polishing occurs in the case of polishing. As a measure taken to cope with such a situation, there has been introduced such a contrivance that dummy patterns are fabricated to reduce the difference in density between the patterns in the wafer.

A polysilicon layer has been used for many kinds of elements such as resistance wiring, a capacitor electrode, etc. as well as a gate electrode of a transistor. The type and density of impurity to be introduced also come in many forms and correspondingly, ion-implantation conditions also vary widely. Depending on the devices, there have been considered various forms such as a case in which a region subjected to ion implantation and a region with no ion implantation exist in mixed form on the same wafer, the use of a non-doped polysilicon gate perfectly unsubjected to ion implantation, etc.

Patent documents 1 through 3:
Japanese Unexamined Patent Publication No. 2000-58511
Japanese Unexamined Patent Publication No. 2000-164732
Japanese Unexamined Patent Publication No. Hei 11(1999)-204506

As described above, the dual gate type device has a problem in that when the N type polysilicon gate and the P type polysilicon gate are simultaneously dry-etched, it is difficult to control them to the same finished dimension. As a result, a problem has arisen that the miniaturization of the transistor and an improvement in the performance thereof have been impaired.

SUMMARY OF THE INVENTION

The present invention has been made in view of the above problems. The present invention aims to provide a semiconductor device comprising an N type polysilicon gate and a P type polysilicon gate both disposed simultaneously, wherein a dummy gate made of non-doped polysilicon is disposed for polysilicon gate etching and set so as to take an area larger than the total area of the N type polysilicon gate and the P type polysilicon gate, followed by patterning of polysilicon gate electrodes.

The present invention provides a device in which both an N type polysilicon gate and a P type polysilicon gate are disposed in mixed form, wherein the area of a non-doped polysilicon gate corresponding to a dummy electrode is set larger than the total area of the N type and P type doped polysilicon gates, thereby to make it possible to control etching of the polysilicon gates so as to be rate-controlled in a non-doped region and to reduce the difference in etching dimension between the N type polysilicon gate and the P type polysilicon gate. As a result, the miniaturization of the device having the N type and P type polysilicon gates and an improvement in its performance are enabled and hence an LSI high in reliability can be realized.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
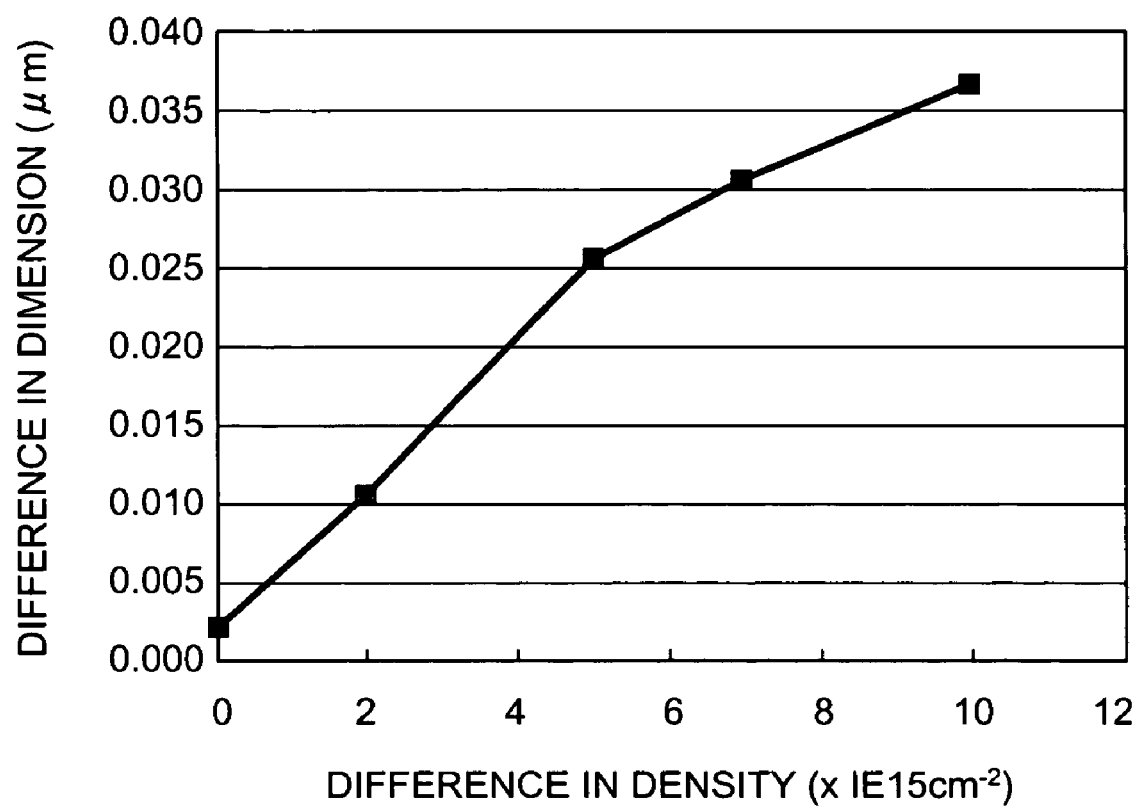
FIG. 1 is a view showing problems on dry etching of gate electrodes employed in a prior art.

A first embodiment of the present invention will be explained. Although not shown in the drawing, a gate insulating film is formed on a silicon substrate 1 and thereafter a polysilicon layer 2 constituted as gate electrodes is deposited thereon. Next, a resist 3 is subjected to patterning. Phosphorous (P) ions are selectively implanted into a region 4 for forming an N type channel transistor gate (see FIG. 3(a)). Boron (B) ions are selectively implanted into a region 5 for forming a P type channel transistor gate (see FIG. 3(b)). At this time, no impurity is injected into a dummy gate electrode region 6. Subsequently, patterning is done by a lithography technique and the non-doped polysilicon and doped polysilicon regions 4 and 5 in the dummy gate electrode region 6 are etched to form gate electrodes (see FIG. 3(c)).

Figure 3A:
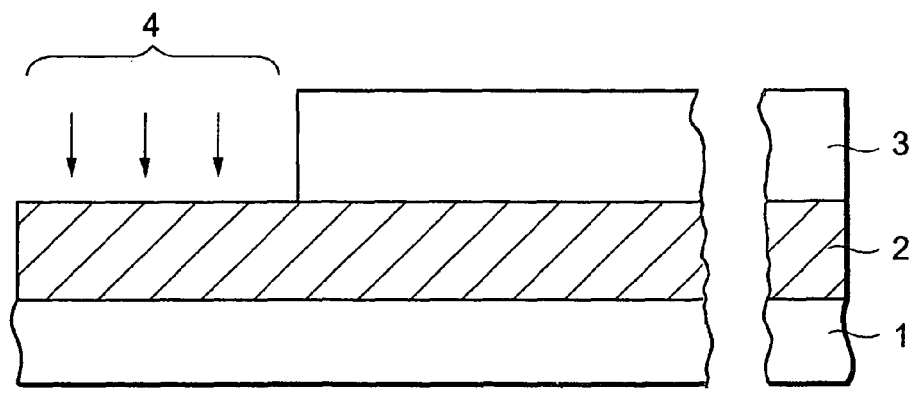
FIG. 3 is a dry etching process sectional view for describing an embodiment of the present invention.
Figure 3B:
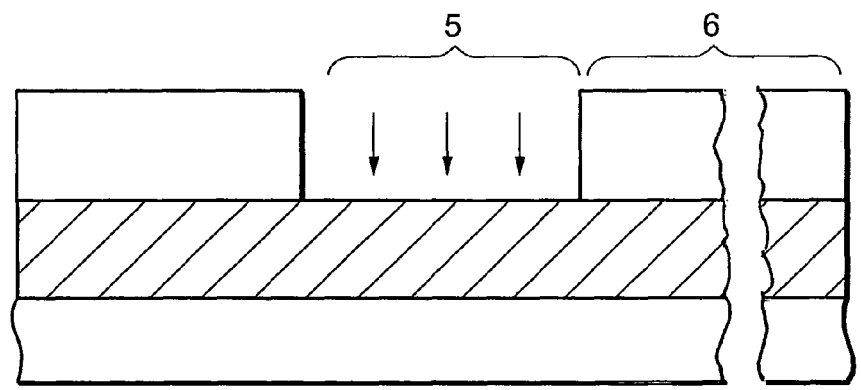
Figure 3C:
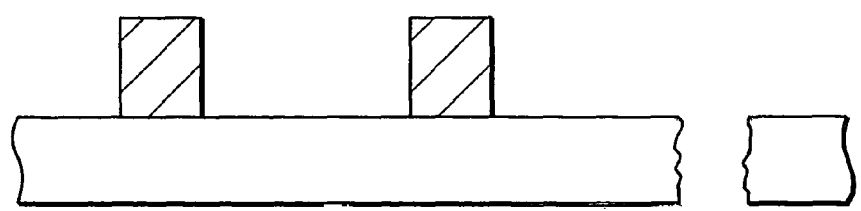

In FIGS. 3(a)-3(c), the line break on the right side indicates that region 6 may extend horizontally in the figures farther than is shown, such that an area of the region 6 would be greater than an area of the region 4 and/or region 5. Even without taking the break into account, FIG. 3(c) shows that the area occupied by the etched non-doped polysilicon region 6 is larger than the total area occupied by the N-type and P-type polysilicon regions gates which have been etched.

FIGS. 3(a)-3(c) also show how the regions are contiguous.

When, for example, chemical mechanical polishing is performed, dummy patterns are disposed to reduce variations in the polishing amount. However, when dummy gate patterns are disposed on a mask, the proportion of the dummy gate patterns made of non-doped polysilicon is set so as to become larger than the proportion of dummy gate patterns made of doped polysilicon. As a result, the end point detection of gate electrode etching in a main step at the gate electrode etching is rate-controlled by etching of the non-doped polysilicon. Thus, the etching rate at the gate electrode etching can be set so as to be substantially determined by the corresponding dummy gate corresponding to the non-doped polysilicon.

After a polysilicon layer has been ion-implanted over its entire surface, the polysilicon layer was etched under etching conditions similar to the prior art and its etching rate was measured. When P ions are implanted 5E15 cm$^{-2}$, the end point detection of etching of polysilicon is carried out in 35 seconds, whereas when B ions are implanted 5E15 cm$^{-2}$, the end point detection under the same etching conditions needs a time interval of 55 seconds. It is understood that the end point detection is done in 45 seconds in the case of the non-doped polysilicon free of ion implantation, and the etching rate greatly changes with the ion implantation.

Figure 2:
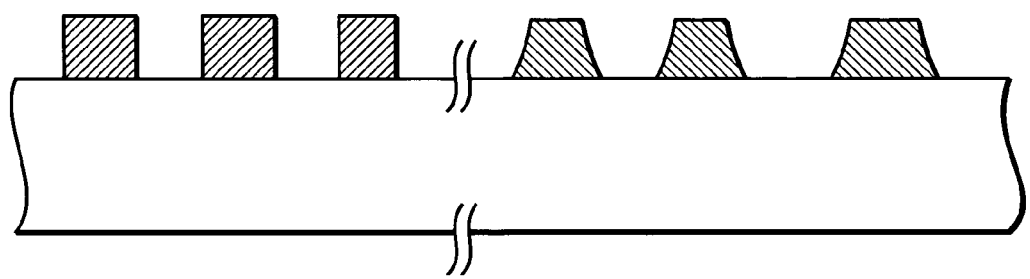
FIG. 2 is a view illustrating dry-etched shapes of the gate electrodes employed in the prior art.

This is because such a phenomenon occurs due to the fact that the etching of the polysilicon layer in the P type polysilicon gate region is not yet ended at the detection of the etching end point in the N type polysilicon gate region, and the polysilicon layer that remains in high-pressure overetching corresponding to the next step is etched so that each resultant polysilicon layer in the P type region is taper-shaped as shown in FIG. 2. Therefore, the end point detection time is prolonged up to the time determined according to the etching rate in the non-doped polysilicon region, thereby making it possible to reduce the amount of taper in the P type region and hence reduce a difference in dimension due to ion species.

Incidentally, although excessive etching is applied to the polysilicon layer in the N type region upon overetching for reducing the amount of taper in the P type region, a product yielded by reaction with HBr gas used in etching is deposited on each polysilicon gate sidewall. Therefore, side etching in a transverse direction does not make progress and hence a change in gate dimension in the N type region at overetching is less reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A dry etching method for a semiconductor device, comprising:
   providing a polysilicon layer formed on a silicon substrate;
   implanting a first region of the polysilicon layer with N type ions and a second region of the polysilicon layer with P type ions, a further region of the polysilicon layer being left as a non-doped region;
   simultaneously gate-etching an N type polysilicon gate electrode from the first region, a P type polysilicon gate electrode from the second region, and a non-doped polysilicon dummy gate arrangement from the non-doped region of the polysilicon layer during a two-stage etching process;
   wherein the N type polysilicon gate electrode has an area that is smaller than the area of the first region of the polysilicon layer and the P type polysilicon gate electrode has an area that is smaller than the area of the second region of the polysilicon layer,
   wherein the etched area of the non-doped polysilicon region is larger than the sum of the etched area of the first region of the polysilicon layer and the etched area of the second region of the polysilicon layer, and
   wherein an end point detection of one of the stages of the etching process is based on the etching of the non-doped polysilicon dummy gate arrangement.

2. The dry etching method according to claim 1, wherein the two-stage etching includes a first stage using a mixed gas of HBr and $O_2$ and a second stage using a mixed gas of HBr, $O_2$ and He.

3. The dry etching method according to claim 1, wherein the N type polysilicon gate electrode and the P type polysilicon gate electrode are disposed adjacent one another.

4. The dry etching method of claim 1, wherein the non-doped polysilicon dummy gate arrangement is disposed adjacent to at least one of the N type polysilicon gate electrode and the P type polysilicon gate electrode.

5. A dry etching method for a semiconductor device, comprising:
   providing a polysilicon layer formed on a semiconductor substrate;
   implanting a first region of the polysilicon layer with N type ions and a second region of the polysilicon layer with P type ions, a further region of the polysilicon layer being left as a non-doped region; and
   simultaneously etching an N type polysilicon gate electrode from the first region, a P type polysilicon gate electrode from the second region, and a non-doped polysilicon dummy gate arrangement from the non-doped region of the polysilicon layer during a multi-stage etching process, wherein the N type polysilicon gate electrode has an area that is smaller than the area of the first region of the polysilicon layer and the P type polysilicon gate electrode has an area that is smaller than the area of the second region of the polysilicon layer, wherein the etched area of the non-doped polysilicon region is larger than the sum of the etched area of the first region of the polysilicon layer and the etched area of the second region of the polysilicon layer, and wherein the etching process includes at least one etching stage in which end point detection is based on the etching of the non-doped polysilicon dummy gate arrangement.

6. The dry etching method according to claim 5, wherein the non-doped polysilicon dummy gate arrangement is disposed adjacent at least one of the P type polysilicon gate electrode and the N type polysilicon gate electrode.

7. The dry etching method according to claim 5, wherein the P type polysilicon gate electrode is disposed adjacent to the N type polysilicon gate electrode.

8. The dry etching method according to claim 5, wherein the at least one etching stage is conducted using a mixed gas of HBr and $O_2$.

9. The dry etching method according to claim 5, wherein the at least one etching stage is conducted using a mixed gas of HBr, $O_2$, and He.

* * * * *